(12) United States Patent
Hall et al.

(10) Patent No.: US 6,472,695 B1
(45) Date of Patent: Oct. 29, 2002

(54) INCREASED LATERAL OXIDATION RATE OF ALUMINUM INDIUM ARSENIDE

(75) Inventors: Eric M. Hall; Larry A. Coldren, both of Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 40 days.

(21) Appl. No.: 09/594,838

(22) Filed: Jun. 15, 2000

Related U.S. Application Data

(60) Provisional application No. 60/140,009, filed on Jun. 18, 1999.

(51) Int. Cl.$^7$ .......................................... H01L 31/0304
(52) U.S. Cl. .......................................... 257/190; 257/18
(58) Field of Search .................................. 257/18, 190

(56) References Cited

U.S. PATENT DOCUMENTS

| | | |
|---|---|---|
| 4,119,993 A | 10/1978 | Hartnagel et al. |
| 4,144,634 A | 3/1979 | Chang |
| 4,246,296 A | 1/1981 | Chang |
| 4,291,327 A | 9/1981 | Tsang |
| 4,578,127 A | 3/1986 | Gossard |
| 4,710,478 A | 12/1987 | Yoder et al. |
| 4,729,000 A | 3/1988 | Abrokwah |
| 4,745,449 A | 5/1988 | Chang et al. |
| 4,843,450 A | 6/1989 | Kirchner et al. |
| 4,915,744 A | 4/1990 | Ho et al. |
| 5,036,374 A | 7/1991 | Shimbo |
| 5,241,197 A | 8/1993 | Murakami et al. |
| 5,262,360 A | 11/1993 | Holonyak, Jr. et al. |
| 5,308,444 A | 5/1994 | Fitzgerald, Jr. et al. |
| 5,327,448 A | 7/1994 | Holonyak, Jr. et al. |
| 5,353,295 A | 10/1994 | Holonyak, Jr. et al. |
| 5,373,522 A | 12/1994 | Holonyak, Jr. et al. |
| 5,403,775 A | 4/1995 | Holonyak, Jr. et al. |
| 5,425,043 A | 6/1995 | Holonyak, Jr. et al. |
| 5,497,024 A | 3/1996 | Shiboya et al. |
| 5,719,895 A | * 2/1998 | Jewell et al. ............... 257/18 |
| 5,747,838 A | 5/1998 | Mishra et al. |
| 5,798,555 A | 8/1998 | Mishra et al. |
| 5,907,164 A | * 5/1999 | Nakayama ............... 257/192 |

* cited by examiner

*Primary Examiner*—Jerome Jackson
(74) *Attorney, Agent, or Firm*—Gates & Cooper LLP

(57) ABSTRACT

The present invention discloses a device and a method for producing an oxidizable digital alloy that is sufficiently strain-compensated to provide for substantially defect-free growth on indium phosphide. The device comprises a layer of semiconductor material, a first layer, and a second layer. The first layer is indium arsenide and is coupled to the layer of semiconductor material, wherein the first layer of indium arsenide is under a compressive strain by a lattice mismatch between the layer of semiconductor material and the first layer of indium arsenide. The second layer is aluminum arsenide and is coupled to the layer of indium arsenide, wherein the second layer of aluminum arsenide is under a tensile strain by a lattice mismatch between the second layer and the first layer. The first layer and the second layer comprise a digital alloy of aluminum indium arsenide, and create a quasi-strain-compensated substantially defect-free alloy on the layer of semiconductor material therein. A superlattice period of the first layer of indium arsenide and a second layer of aluminum arsenide is selected to allow an oxide of desired depth to be produced from the digital alloy.

13 Claims, 7 Drawing Sheets

INCREASED LATERAL OXIDATION RATE OF ALUMINUM INDIUM ARSENIDE

CROSS-REFERENCE TO RELATED APPLICATIONS

This application claims priority under 35 U. S. C. §119(e) of U.S. Provisional Patent Application No. 60/140,009, filed Jun. 18, 1999, entitled "INCREASED LATERAL OXIDATION RATE OF AlInAs" by Eric M. Hall et al., which application is incorporated by reference herein.

STATEMENT REGARDING FEDERALLY SPONSORED RESEARCH OR DEVELOPMENT

This invention was made with Government support under Grant No. MDA972-98-1-0001, awarded by the Office of Naval Research. The Government has certain rights in this invention.

BACKGROUND OF THE INVENTION

1. Field of the Invention

This invention relates in general to semiconductor devices, and in particular to increased lateral oxidation rates of aluminum indium arsenide (AlInAs).

2. Description of the Related Art

Silicon semiconductor devices have dominated the electronics field for many years. The reason that silicon is widely favored as a base substrate material for semiconductors is the ability to produce semiconducting material, i.e., silicon, and an insulating material i.e., silicon oxide, with good electrical and mechanical properties. The presence of both semiconducting material and insulating material is important for isolation, refractive indices, and other desired electrical and optical properties. However, silicon devices have limitations in speed and in the infrared spectrum. As such, the focus for new materials to be used in these high speed and optical domains has shifted to gallium arsenide (GaAs), indium phosphide (InP), other III–V compounds, and alloys thereof.

Although GaAs does not have a natural oxide like silicon does, techniques have been developed to provide a lattice-matched oxide for GaAs devices through the wet thermal oxidation of aluminum gallium arsenide (AlGaAs). However, a suitable material for oxidation to be used in conjunction with InP devices has been unavailable. Attempts have been made to use aluminum arsenide antimonide (AlAsSb) as a wet oxidation material, and even though AlAsSb is lattice matched to InP, wet oxidation of AlAsSb leaves an elemental layer of antimony at the oxide-semiconductor interface, which is unacceptable from both electrical and optical standpoints.

Other attempts at finding a lattice-matched material for InP devices have focused on aluminum indium arsenide (AlInAs). Related art attempts to thermally wet oxidize AlInAs have shown that the low aluminum mole fraction of lattice-matched AlInAs slows the rate of oxidation, and requires higher temperatures to perform the oxidation, which degrades the surface quality of the AlInAs. The degradation of the surface quality makes the AlInAs related art attempts unacceptable for use in the optical regime, and makes the resultant devices more difficult to process and produce in the electrical regime.

It can be seen, then, that there is a need in the art for a material that can be used as an oxide in conjunction with InP. It can also be seen that there is a need in the art for an InP quasi-lattice-matched material that can be thermally wet oxidized without excessive temperature. It can also be seen that there is a need in the art for an InP-based material that can be thermally wet oxidized at a higher oxidation rate.

SUMMARY OF THE INVENTION

To minimize the limitations in the prior art described above, and to minimize other limitations that will become apparent upon reading and understanding the present specification, the present invention discloses a device and a method for producing an oxidizable digital alloy that is nearly strain-compensated, such that it can be deposited without substantial defects on indium phosphide. The device comprises a layer of semiconductor material, a first layer, and a second layer. The first layer is indium arsenide and is coupled to the layer of semiconductor material, wherein the first layer of indium arsenide is under a compressive strain by a lattice mismatch between the layer of semiconductor material and the first layer of indium arsenide. The second layer is aluminum arsenide and is coupled to the layer of indium arsenide, wherein the second layer of aluminum arsenide is under a tensile strain by a lattice mismatch between the second layer and the first layer. The first layer and the second layer comprise a digital alloy of aluminum indium arsenide, and create a material that is approximately strain-compensated on the layer of semiconductor material therein. A superlattice period of the first layer of indium arsenide and a second layer of aluminum arsenide is selected to allow an oxide of desired depth to be produced from the digital alloy.

An object of the invention is to provide a material that can be used as an oxide in conjunction with InP. Another object of the invention is to provide an InP quasi-lattice-matched material that can be thermally wet oxidized without excessive temperature. Another object of the invention is to provide an InP based material that can be thermally wet oxidized at a higher oxidation rate.

BRIEF DESCRIPTION OF THE DRAWINGS

Referring now to the drawings in which like reference numbers represent corresponding parts throughout.

DETAILED DESCRIPTION OF THE INVENTION

Figure 1:
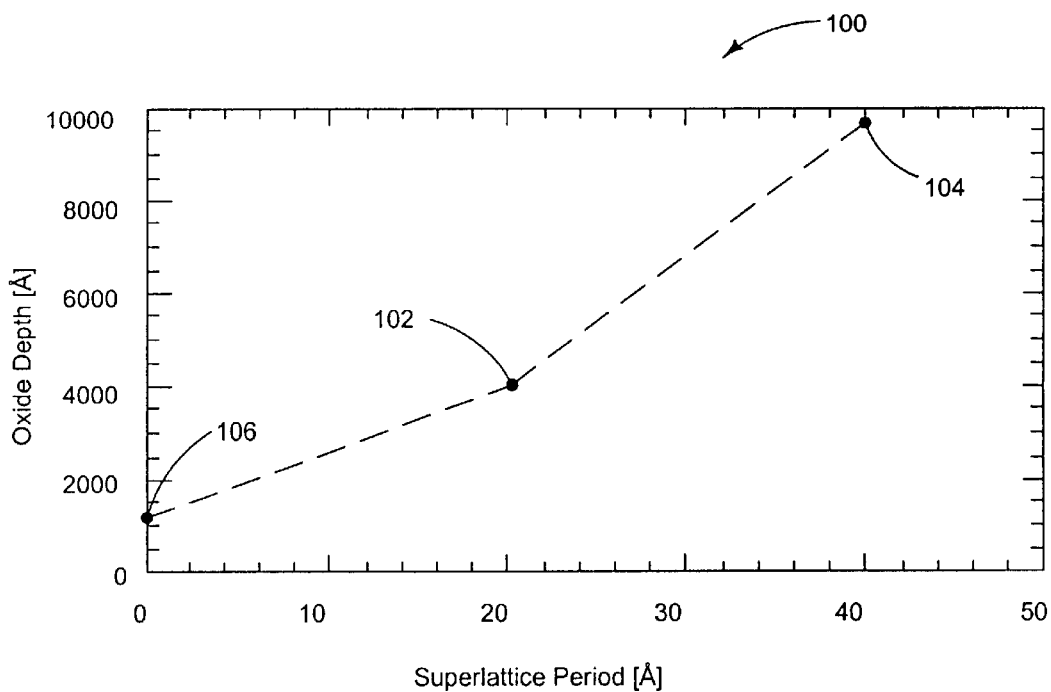
FIG. 1 illustrates a graph of oxide depth as a function of AlInAs superlattice period for a fixed oxidation time.

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The wet thermal oxidation of AlGaAs compounds has found many useful applications in GaAs-based devices, including both high contrast mirrors and current apertures for vertical-cavity lasers. For InP-based devices, however, similar progress has been limited by the absence of a suitable oxidation material lattice-matched to the InP substrate. The oxidation of lattice-matched AlAsSb compounds has been found to leave an elemental antimony layer at the oxide-semiconductor interface, and the low Al mole fraction of lattice-matched AlInAs slows oxidation rates and demands higher temperatures, leading to the degradation of surface quality.

The present invention achieves a significant increase in oxidation rate by growing the AlInAs layer as a digital alloy of AlAs and InAs with the rate increasing with superlattice period thickness. The tensile strain in the AlAs layers is approximately balanced by the compressive strain in the InAs layers, creating a strained layer that is quasi-lattice-matched to InP. The degree of strain compensation can be varied by varying the relative layer thicknesses of the AlAs and InAs. Thicker layers of AlAs are generally advantageous, but any range of relative thicknesses that is substantially defect free improves the oxidation properties of the digital alloy of the present invention. It is also generally advantageous to make each layer as thick as possible, but 30 angstroms per layer appears to be the practical defect-free limit. The maximum net strain should be less than +/−1.5% for the entire stack and at the higher strain levels, the overall stack thickness is limited to smaller values.

These layers were all cladded by InGaAs. Related attempts have shown that the oxidation rate can be increased by using InP cladding, which is compatible with the present invention.

A crystal is a periodic array of atoms. The period of the atoms, as well as the shape and/or symmetry of the periodic array, is defined by numbers called lattice constants. The lattice constant is the distance between the center of one atom and the center of the next atom in a given direction as the periodic array is traversed. For crystals that contain atoms of more than one element, e.g., AlAs, the lattice constant typically describes the distance between one atom and another atom of the same elemental type.

A superlattice is created by making an artificial crystal of one or more elements. The superlattice "period," which is similar to the lattice constant of a typical crystal, depends on the thickness of the crystal's quantum wells as well as the thickness of the crystal's barrier layers.

Oxidation as a Function of Superlattice Period

FIG. 1 illustrates a graph of oxide depth as a function of AlInAs superlattice period for a fixed oxidation time.

Graph 100 shows that as the superlattice period of the AlInAs material changes, the depth of the oxide changes for a fixed oxidation time. For example, point 102 illustrates that when the AlInAs material has a superlattice period of 20 angstroms (Å) the oxide depth for a certain oxidation time is approximately 3700 angstroms. For the same time period of oxidation, point 104 shows that AlInAs material that has a superlattice period of 40 angstroms will achieve an oxide depth of 9500 angstroms. Similarly, point 106 illustrates that for the same time period, a superlattice period of zero angstroms, e.g., the material is an analog alloy of AlInAs, the oxide depth is approximately 1200 angstroms.

As such, by changing the superlattice period of the AlInAs material, either through alloys of AlAs and InAs, or through changing the concentrations of aluminum, indium, and arsenic in the AlInAs material, the desired oxide depth can be achieved in a given amount of time. If the time portion of the processing of such devices is critical, e.g., because the oxidation takes place at a higher temperature and will have deleterious effects on other portions of the structure, then such a change in the superlattice period would be needed to allow such devices to be produced. The present invention focuses on using a digital alloy of AlAs and InAs as a replacement for a ternary AlInAs material, wherein aluminum and indium atoms are randomly placed in the arsenic crystal lattice.

Other parameters that can be used in determining the thickness of the oxidized layer of AlInAs, in addition to or instead of the superlattice period, are the ratio of AlAs to InAs, the overall thickness of the AlAs/InAs digital alloy stack, i.e., how many periods of AlAs/InAs are present in the stack of material to be oxidized, and the range of overall strain in the AlAs/InAs stack. Other parameters can also be important to the creation of an oxide from the AlAs/InAs stack, such as pressure, or temperature as described with respect to FIG. 2.

Oxidation as a Function of Temperature

Figure 2:
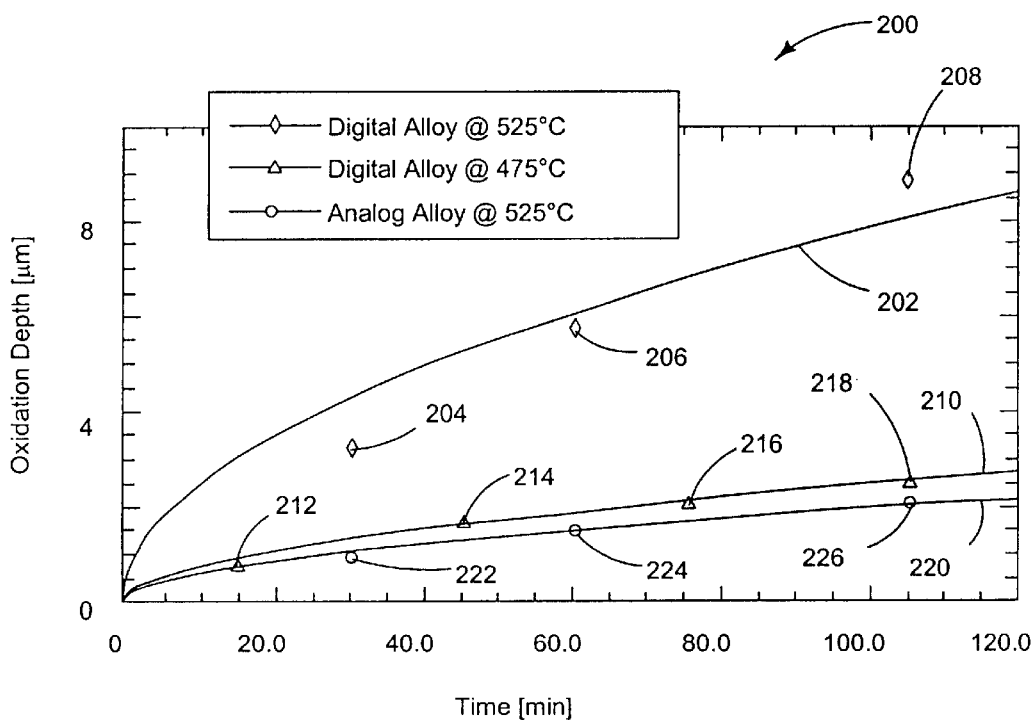
FIG. 2 illustrates a graph of several materials processed at different times and temperatures in accordance with the present invention.

FIG. 2 illustrates a graph of several materials processed at different times and temperatures in accordance with the present invention.

Graph 200 illustrates the oxidation depth as a function of time for several alloys. Line 202 is generated as a best-fit curve for points 204, 206, and 208. Line 202 corresponds to the oxide depth generated for a digital alloy of AlInAs having a 40 angstrom superlattice period as a function of time at a temperature of 525 degrees centigrade. An example of a digital alloy of AlInAs that has a 40 angstrom superlattice period is, for example, a 20 angstrom period AlAs layer and approximately 21 angstrom period InAs layer attached to the AlAs layer.

As shown by line 202, for a constant temperature of 525 degrees centigrade, the digital alloy AlInAs with 40 angstrom superlattice period will achieve an oxidation depth of approximately 3.2 microns at 30 minutes oxidation time as shown by point 204, approximately 5.7 microns at 60 minutes oxidation time as shown by point 206, and approximately 8.8 microns at 105 minutes oxidation time as shown by point 208.

Line 210 is generated as a best-fit curve for points 212, 214, 216, and 218, for the same digital alloy used to generate line 202. However, line 210, and points 212–218, were determined at an oxidation temperature of 475 degrees centigrade, not 525 degrees centigrade.

As shown by line 210, for a constant temperature of 475 degrees centigrade, the digital alloy AlInAs with 40 angstrom superlattice period will achieve an oxidation depth of only approximately 0.75 microns at 15 minutes oxidation time as shown by point 212. By using line 202, and comparing the increased temperature line 202 with point 212, it is noted that increasing the temperature of the oxidation procedure will increase the oxidation depth considerably.

Line 220 is generated as a best-fit curve for points 222–226, which were measured to determine the oxidation rate of an analog alloy of AlInAs at 525 degrees centigrade. An analog alloy is generated by creating a mixture of aluminum, indium, and arsenide and generating a single crystalline structure from the three elements. Again, the digital alloy of line 202 has a much larger oxidation rate than the analog alloy of line 220, even if the temperature and time elements are fixed, as shown in graph 200.

Experimental results have shown that when oxidation times are less than two hours, that the surface quality of the devices is substantially unharmed at the temperatures listed in FIG. 2. Further, the digital alloy at 525 degrees centigrade allows practical oxidation depths to be achieved within that two hour period of thermal wet oxidation.

The digital alloy of AlInAs described in FIG. 2 is typically grown using Molecular Beam Epitaxy (MBE). Despite the substantial strain in the system, high quality layers of AlAs and InAs with very smooth interfaces have been grown using MBE.

Device Structure

FIGS. 3A–3D illustrate an exemplary device in accordance with the present invention.

Figure 3A:
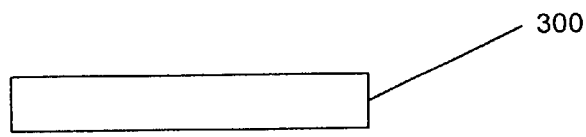
FIGS. 3A–3F illustrate an exemplary device structure in accordance with the present invention.

FIG. 3A illustrates substrate 300. Substrate 300 is typically an indium phosphide (InP) substrate, an aluminum indium gallium arsenide (AlInGaAs) substrate, or a layer of semiconductor material of InP, AlInGaAs, or other material.

Figure 3B:
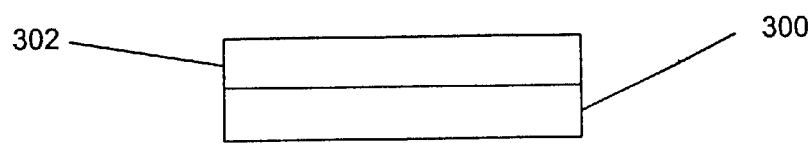

FIG. 3B illustrates layer 302 grown on substrate 300. Layer 302 is typically indium arsenide (InAs).

Figure 3C:
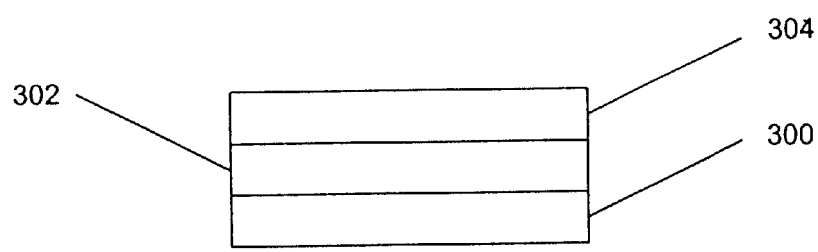

FIG. 3C illustrates layer 304 grown on layer 302. Layer 304 is typically aluminum arsenide (AlAs). The digital alloy AlInAs comprises layers 302 and 304. The practical limit of the superlattice period of such layers 302–304 is approximately between five angstroms and sixty angstroms.

When IaAs layer 302 is grown via MBE, or other growth methods, onto substrate 300, the InAs layer 302 does not have an exact lattice match to InP substrate 300. InAs layer 302 has a compressive strain within the crystalline structure of InAs layer 302 because of the lattice mismatch between InAs layer 302 and substrate 300. As AlAs layer 304 is grown on top of InAs layer 302, there is again a lattice mismatch between AlAs layer 304 and InAs layer 302; however, the strain between layers 302 and 304 is in the opposite direction, i.e., tensile strain, to the strain between layer 302 and substrate 300. Since the strains between the layers are in the opposite direction, the digital alloy InAs layer 302 and AlAs layer 304 are approximately strain-compensated such that layers 302 and 304 can be grown substantially defect-free on an InP substrate 300. The degree of strain compensation between layers 302 and 304 can be varied by varying the thicknesses of layers 302 and 304, such that the strain can be exactly compensated, or such that there is a net strain in the combination of layers 302 and 304.

Figure 3D:
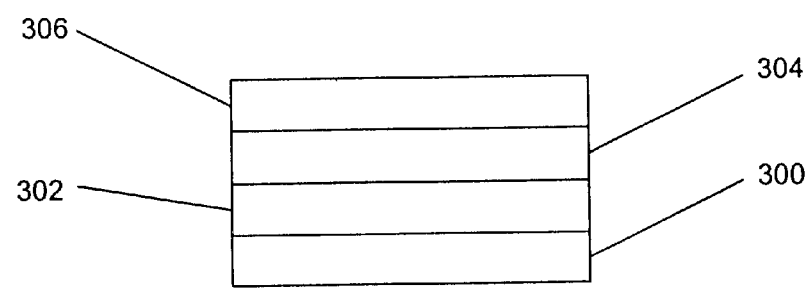

FIG. 3D illustrates layer 306 grown on layer 304. Layer 306 can be a contact layer, or another layer of material that is lattice matched to layer 304. Further, layer 306 can be another period of the superlattice, e.g., layer 306 can be a layer of InAs and AlAs, etc. Multiple layers 306 can be grown on layer 304 without departing from the scope of the present invention.

Figure 3E:
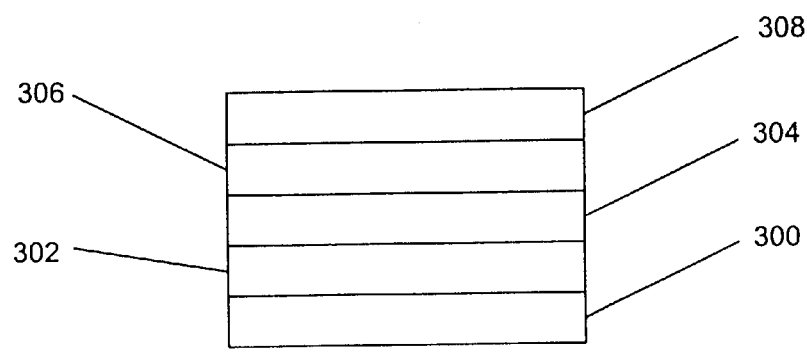

FIG. 3E illustrates layer 308 grown on layer 306. Layer 308 shows that the layer structure of the device can continue beyond two layers or two periods of AlAs and InAs layers.

Figure 3F:
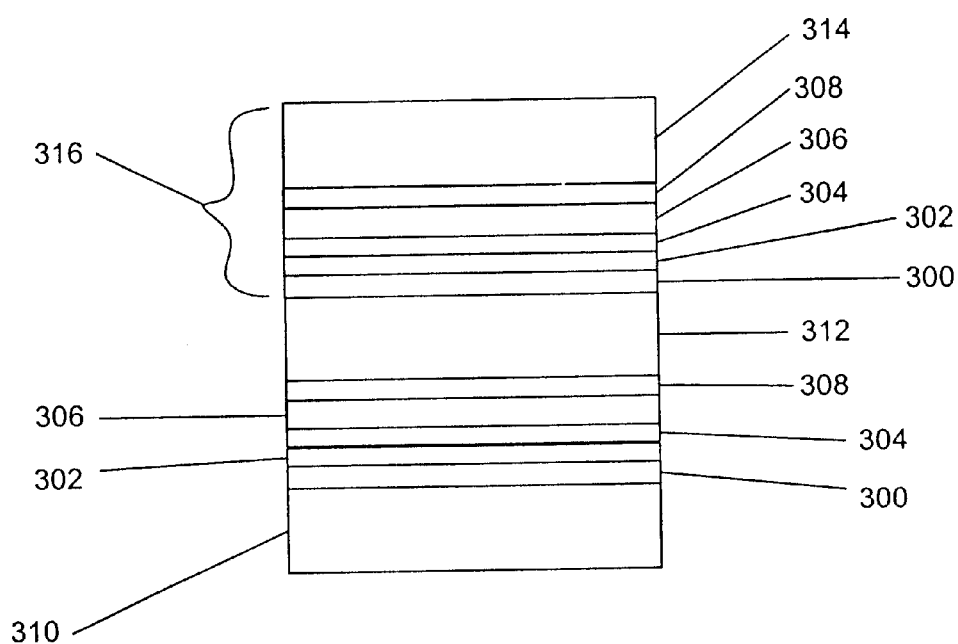

FIG. 3F illustrates a Distributed Bragg Reflector (DBR). Layers 300–308 are shown as described in FIGS. 3A–3E. Layer 310 is shown as being coupled to layer 300. Layer 310 is a lattice matched layer to the layer 300, and is typically aluminum indium gallium arsenide (AlInGaAs) or indium phosphide (InP), but can be made of other materials. Layer 312 is shown as being grown on top of layer 308, and is typically the same material as layer 300. An additional layer stack of layers 300–308 is repeated and grown on layer 312. Layer 314 is then grown on top of the second layer 308. A larger or smaller number of layers 300–308 can be used between layers 310 and 312 without departing from the scope of the present invention. A period 316 of the DBR is also shown as comprising layer 314 and layers 300–308, e.g., one instance of a first material used to make layer 314, and one instance of the digital alloy comprising layers 300–308. A DBR can be made having one or more periods, depending on the desired reflective characteristics and desired wavelength to be reflected and/or transmitted by the DBR structure.

Experimental Results

Figure 4:
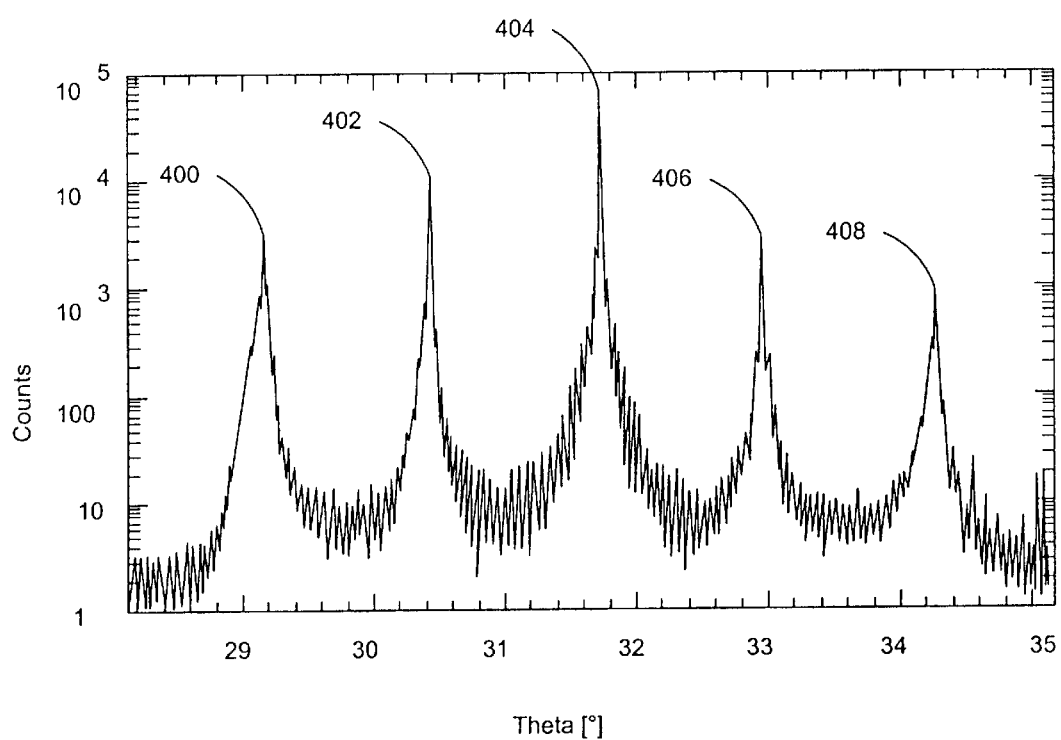
FIG. 4 illustrates an x-ray diffraction spectrum of a ten period distributed Bragg reflector using the digital alloy of the present invention.

FIG. 4 illustrates an x-ray diffraction spectrum of a ten period distributed Bragg reflector using the digital alloy of the present invention.

A low arsenic pressure, e.g., approximately $6 \times 10^{-6}$ Torr, and a low substrate temperature, e.g., ~300 degrees Centigrade, were important to the surface quality of the growth of layers 300–308. The growth rates of the InAs and AlAs are ~0.45 microns/hour and ~0.4 microns/hour, respectively.

In the DBR of FIG. 4, the layers 300–308, i.e., the digital alloy of the present invention, were used as the low index layer, whereas layers 310–314 were used as the high index layer. Layers 310–314 were made of AlInGaAs, but can also be made of InP with similar results.

DBRs of up to ten periods have been grown using the structure described with respect to FIG. 3F. Peaks 400–408 illustrate that the DBR structure using the digital alloy of the present invention were grown without any degradation of the growth surface.

Process Chart

Figure 5:
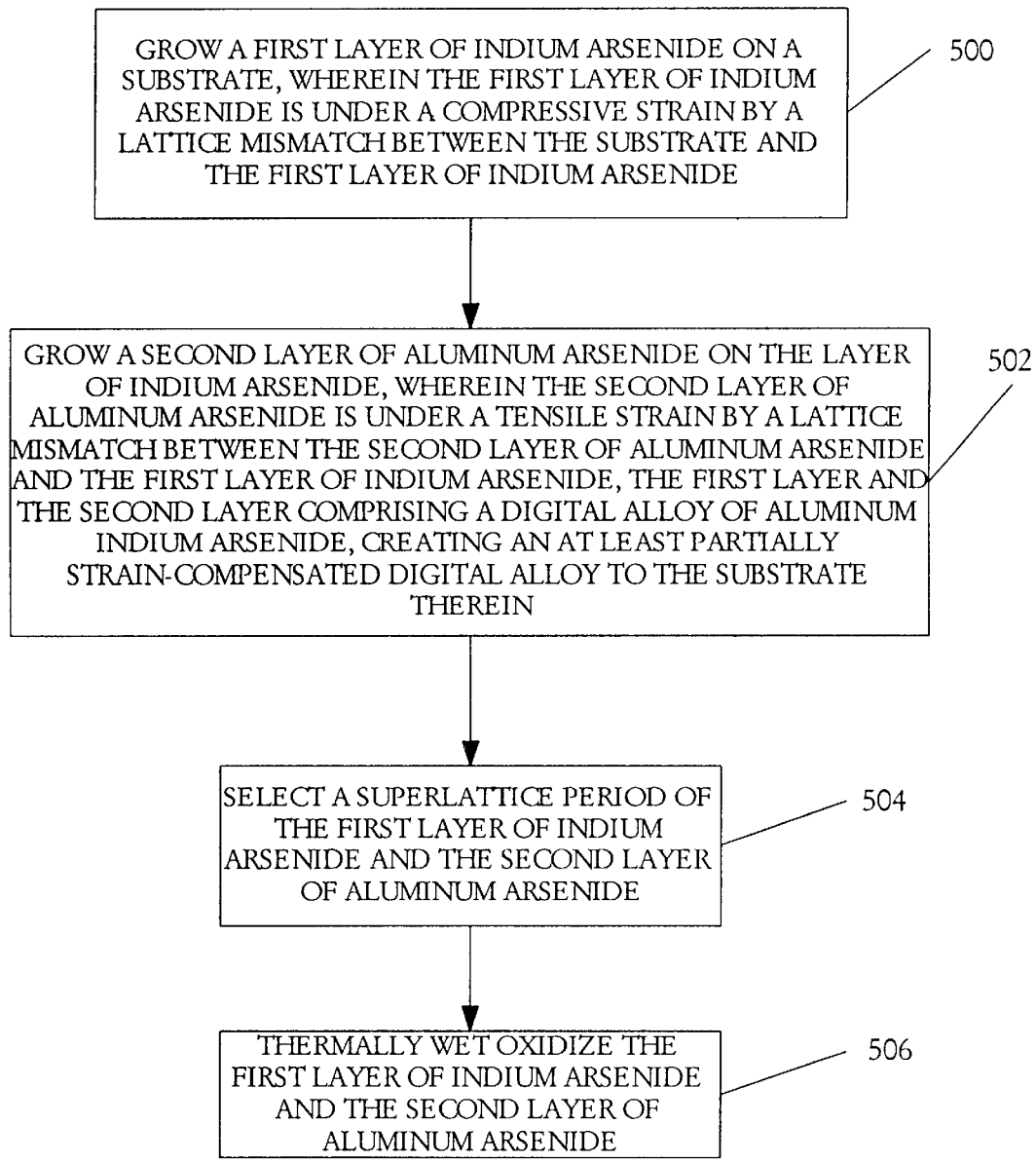
FIG. 5 illustrates a flowchart indicating the steps used in practicing the present invention.

FIG. 5 illustrates a flowchart indicating the steps used in practicing the present invention.

Block 500 illustrates the step of growing a first layer of indium arsenide on a substrate, wherein the first layer of indium arsenide is under a compressive strain by a lattice mismatch between the substrate and the first layer of indium arsenide.

Block 502 illustrates the step of growing a second layer of aluminum arsenide on the layer of indium arsenide, wherein the second layer of aluminum arsenide is under a tensile strain by a lattice mismatch between the second layer of aluminum arsenide and the first layer of indium arsenide, the first layer and the second layer comprising a digital alloy of aluminum indium arsenide, creating a material with some degree of strain compensation for substantially defect-free growth on the substrate therein.

Block 504 illustrates the step of selecting a superlattice period of the first layer of indium arsenide and the second layer of aluminum arsenide.

Block 506 illustrates the step of thermally wet oxidizing the first layer of indium arsenide and the second layer of aluminum arsenide.

Tapered Alloys and Additional Embodiments

Figure 6A:
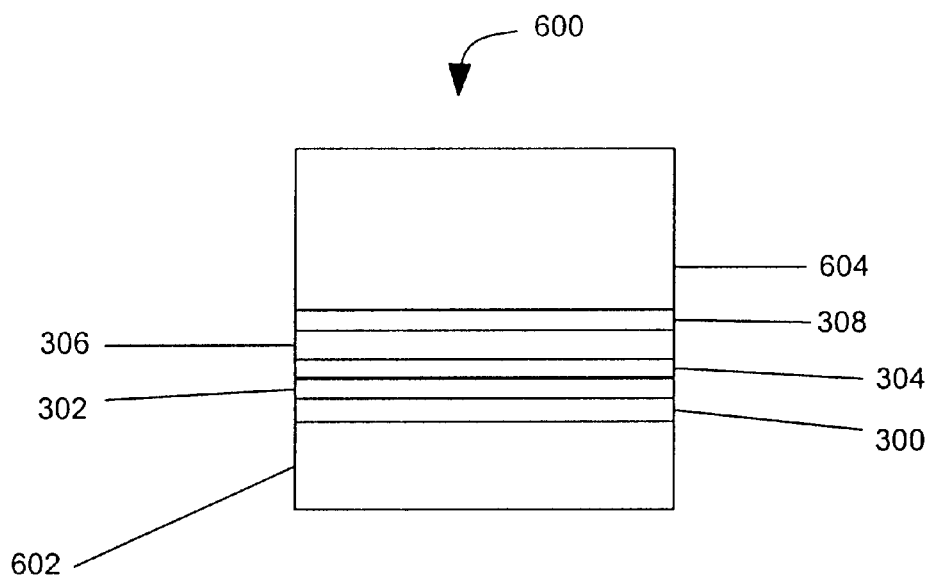
FIGS. 6A and 6B illustrate a tapered alloy that can be created using the present invention.
Figure 6B:
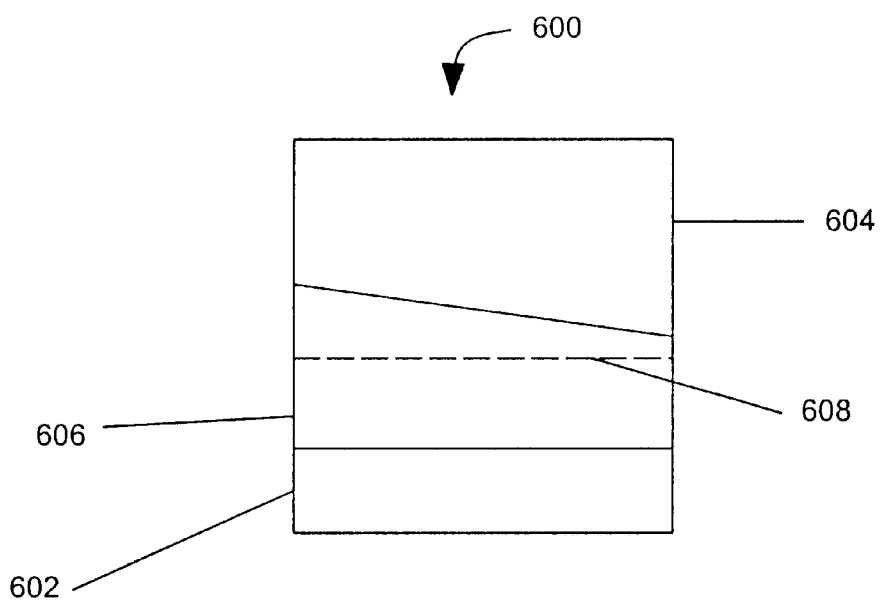

FIGS. 6A and 6B illustrate a tapered alloy that can be created using the present invention. Device 600 is shown comprising a substrate or layer 602, a digital alloy comprising layers 300–308 as described with respect to FIGS. 3A–3F, and a layer 604. Layer 604 is typically an analog alloy of AlInAs. Device 600 is then wet-oxidized, and by selecting the period of the superlattice defined by layers 300–308, or the number of layers 300–308, or the net strain created by the layers 300–308, the time of the wet oxidation, the ratio of the AlAs to InAs in the layers 300–308, as well as the overall thickness of the layers 300–308 combined, a tapered alloy can be created as shown in FIG. 6B. FIG. 6B illustrates again layer 604, and layer 602, but shows that oxide layer 606 is created. Interface 608 has been illustrated to indicate the interface between layer 308 and layer 604. Layer 606 is completely oxidized, whereas layer 604 is oxidized in a tapered fashion in the vertical direction.

Figure 7:
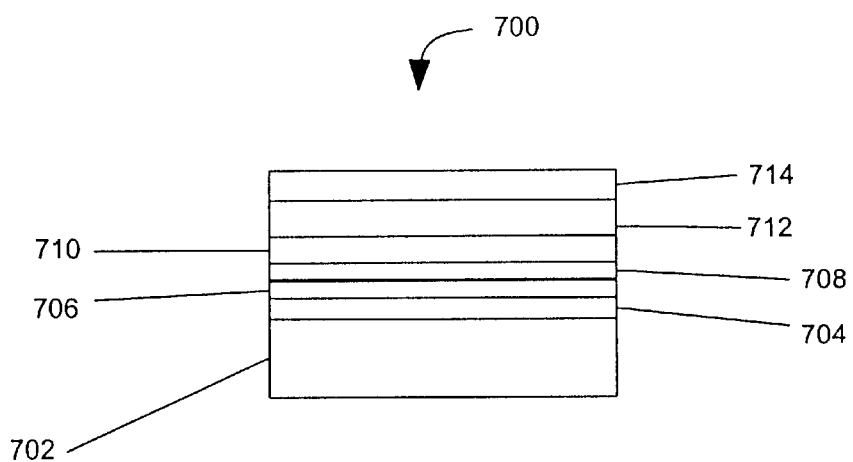
FIG. 7 illustrates an additional embodiment of the present invention.

FIG. 7 illustrates an additional embodiment of the present invention. Device 700 comprises layers 702–714. Layers 702–714 can be of different thicknesses. Further, layers 702–714 can comprise additional elements other than AlAs and InAs; for example, layers 706–712 can be alternating layers of AlAs and InAs as described with respect to FIGS. 3A–3F, and layers 704 and 714 can be InP cladding layers. Another example of the layer structure created by device 700 can be that InP layers can be interleaved with the AlAs/InAs digital alloy, for example, layer 704 can be an AlAs layer, layer 706 can be an InAs layer, layer 708 can be an InP layer, layer 710 can be a second AlAs layer, layer 712 can be a second InAs layer, and layer 714 can be a contact layer, a larger thickness InP layer, an analog AlInAs layer, or other layer.

Conclusion

This concludes the description of the preferred embodiment of the invention. The following paragraphs describe some alternative methods of accomplishing the same objects. The present invention, although described with InAs as the first layer to be grown on the substrate, can have AlAs as the first layer if desired. Further, other digital alloys that are lattice matched to InP, other superlattice periods, or a combination of other materials and superlattice periods can be used without departing from the scope of the present invention.

In summary, the present invention discloses a device and a method for producing an oxidizable digital alloy that is quasi-strain-compensated, and can be grown substantially defect-free on indium phosphide. The device comprises a layer of semiconductor material, a first layer, and a second layer. The first layer is indium arsenide and is coupled to the layer of semiconductor material, wherein the first layer of indium arsenide is under a compressive strain by a lattice mismatch between the layer of semiconductor material and the first layer of indium arsenide. The second layer is aluminum arsenide and is coupled to the layer of indium arsenide, wherein the second layer of aluminum arsenide is under a tensile strain by a lattice mismatch between the second layer and the first layer. The first layer and the second layer comprise a digital alloy of aluminum indium arsenide, and create at least a partially strain-compensated substantially defect-free alloy on the layer of semiconductor material therein. A superlattice period of the first layer of indium arsenide and a second layer of aluminum arsenide is selected to allow an oxide of desired depth to be produced from the digital alloy.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An oxidizable digital alloy that is at least partially strain-compensated, such that the digital alloy can be grown substantially defect-free on indium phosphide, comprising:
   a layer of semiconductor material;
   a first layer of indium arsenide, coupled to the layer of semiconductor material, wherein the first layer of indium arsenide is under a compressive strain by a lattice mismatch between the layer of semiconductor material and the first layer of indium arsenide; and
   a second layer of aluminum arsenide, coupled to the layer of indium arsenide, wherein the first and second layers are thermally wet oxidized to produce an oxide layer therein, second layer of aluminum arsenide is under a tensile strain by a lattice mismatch between the second layer of aluminum arsenide and the first layer of indium arsenide, the first layer and the second layer comprising a digital alloy of aluminum indium arsenide, creating an at least partially strain-compensated digital alloy to the layer of semiconductor material therein, and wherein a superlattice period of the first layer of indium arsenide and a second layer of aluminum arsenide is selected to allow an oxide to be produced from the digital alloy.

2. The digital alloy of claim 1, wherein the semiconductor material is indium phosphide.

3. The digital alloy of claim 1, wherein the semiconductor material is aluminum indium gallium arsenide.

4. The digital alloy of claim 1, wherein the superlattice period of the first layer and the second layer is selected to produce a desired oxide depth in a desired time period.

5. The digital alloy of claim 1, wherein the superlattice period is between five angstroms and sixty angstroms inclusive.

6. The digital alloy of claim 1, further comprising: a third layer of indium arsenide, coupled to the second layer; and a fourth layer of aluminum arsenide, coupled to the third layer of indium arsenide.

7. The digital alloy of claim 1, further comprising a third layer of material coupled to the second layer.

8. The digital alloy of claim 7, wherein the first layer, second layer, and third layer comprise a period of a distributed Bragg reflector (DBR).

9. The digital alloy of claim 8, wherein in the period of the DBR is repeated at least once.

10. The digital alloy of claim 8, wherein the first layer and second layer are used as a first index material for the period of the DBR.

11. The digital alloy of claim 10, wherein the first index material is a high index material.

12. The digital alloy of claim 1, further comprising a layer of analog aluminum indium arsenide (AlInAs), coupled to the second layer, wherein a thickness of the layer of analog AlInAs and the superlattice period are chosen to create a tapered oxide layer.

13. A distributed bragg reflector (DBR) produced by the steps comprising:
   growing a first layer of indium arsenide on a substrate, wherein the first layer of indium arsenide is under a compressive strain by a lattice mismatch between the layer of substrate and the first layer of indium arsenide;
   growing a second layer of aluminum arsenide on the first layer of indium arsenide, wherein the second layer of aluminum arsenide is under a tensile strain by a lattice mismatch between the second layer of aluminum arsenide and the first layer of indium arsenide, the first layer and the second layer comprising a digital alloy of aluminum indium arsenide, creating an at least partially strain-compensated digital alloy to the substrate therein,
   selecting a superlattice period of the first layer of indium arsenide and the second layer of aluminum arsenide;
   growing a layer of semiconductor material on the second layer of aluminum arsenide, wherein an index of the semiconductor material is different than an index of the digital alloy; and
   thermally wet oxidizing the first layer of indium arsenide and the second layer of aluminum arsenide.

* * * * *